US010692575B1

(12) United States Patent
Huang

(10) Patent No.: US 10,692,575 B1
(45) Date of Patent: Jun. 23, 2020

(54) METHOD FOR SELF-TERMINATED WRITING WITH QUASI-CONSTANT VOLTAGE ACROSS RESISTIVE-TYPE MEMORY ELEMENT AND CIRCUIT THEREOF

(71) Applicant: TARGPS Technology Corp., Republic of Seychelles (SC)

(72) Inventor: Chih-Jen Huang, Hsinchu (TW)

(73) Assignee: 2X Memory Technology Corp., Guangdong Province (CN)

( * ) Notice: Subject to any disclaimer, the term of this patent is extended or adjusted under 35 U.S.C. 154(b) by 0 days.

(21) Appl. No.: 16/368,763

(22) Filed: Mar. 28, 2019

(51) Int. Cl.
*G11C 11/00* (2006.01)
*G11C 13/00* (2006.01)

(52) U.S. Cl.
CPC ...... *G11C 13/0069* (2013.01); *G11C 13/0038* (2013.01); *G11C 2013/0078* (2013.01)

(58) Field of Classification Search
CPC ............ G11C 13/0069; G11C 13/0038; G11C 2013/0078
USPC ........................................................ 365/148
See application file for complete search history.

(56) References Cited

U.S. PATENT DOCUMENTS

| | | | | |
|---|---|---|---|---|
| 6,791,890 B2* | 9/2004 | Ooishi | ................ | G11C 11/1673 365/189.15 |
| 7,359,236 B2* | 4/2008 | Gilbert | ................ | G11C 11/5614 365/163 |
| 9,111,625 B2* | 8/2015 | Ong | ...................... | G11C 29/028 |
| 9,437,292 B1* | 9/2016 | Shih | .................... | G11C 13/0038 |

* cited by examiner

*Primary Examiner* — Tha-O H Bui
(74) *Attorney, Agent, or Firm* — Penilla IP, APC

(57) ABSTRACT

A method for self-terminated writing with quasi-constant voltage drop across resistive-type memory cell is provided. The method comprises: creating a writing voltage and a writing current flowing through a resistive memory cell; reproducing the writing current to generate a reproduced writing current; flowing the reproduced writing current through a dummy circuit to generate a dummy writing voltage; adding the dummy writing voltage and a reference voltage to generate a reference writing voltage, wherein the dummy writing voltage slightly and proportionally increases during writing; and adjusting the writing voltage and the writing current according to the reference writing voltage so that a voltage drop across the resistive memory cell keeps constant or slightly increases during writing. When the reproduced writing current reaches a predetermined target current value, a termination signal is issued. The termination signal turns off the related writing circuits to optimize the writing period of the resistive-type memory cell.

21 Claims, 12 Drawing Sheets

FIG. 1B
(PRIOR ART)
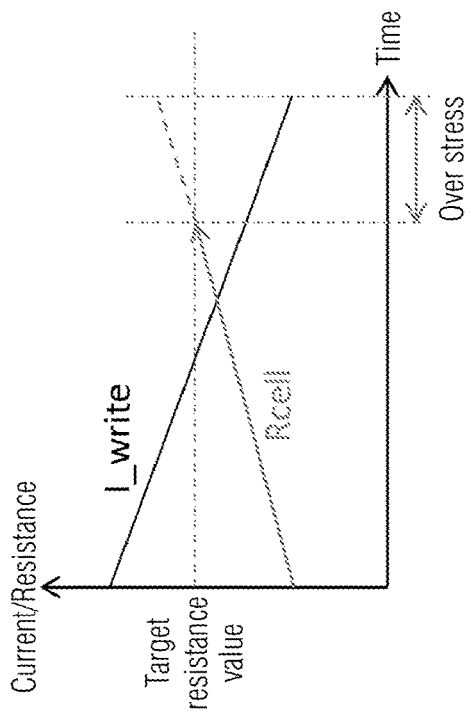
FIG. 1C
(PRIOR ART)
FIG. 1D
(PRIOR ART)

METHOD FOR SELF-TERMINATED WRITING WITH QUASI-CONSTANT VOLTAGE ACROSS RESISTIVE-TYPE MEMORY ELEMENT AND CIRCUIT THEREOF

CROSS REFERENCE TO RELATED APPLICATIONS

The application is related to Taiwanese Patent Application No. 106136443, filed on Oct. 24, 2017, which is expressly incorporated by reference in its entirety.

FIELD

The present invention relates to techniques for writing resistive-type memory, especially to methods and circuits for self-terminated writing with quasi-constant voltage drop across resistive-type memory.

BACKGROUND OF THE INVENTION

In an electronic circuit system, random access memory (RAM) is an essential component. Conventional types of random access memory include static random access memory (SRAM) and dynamic random access memory (DRAM). However, the data stored in SRAM or DRAM disappears after the system power supply shuts down. Therefore, for applications that require the data to be kept after the power supply shuts down, a memory device that can keep the stored data after the power supply stops supplying power is desired. Nonvolatile memory (NVM) is a device satisfying such applications.

Currently, the types of nonvolatile memory that have been developed include flash memory, eFuse, magnetoresistive random access memory (MRAM), ferroelectric random-access memory, phase change memory (PCM) and resistive random-access memory (RRAM), etc. Those kinds of memory device can retain the stored data after a power supply shuts down. Especially, the resistive random access memory (referred to as resistive-type memory herein) is a type of nonvolatile memory which the industry is actively developing. The resistive-type memory has advantages in low operational voltage, short writing time, long data retention period, simple structure, smaller circuit area, etc., and would be a type of memory device with a great application potential.

Despite the advantages of resistive-type memory mentioned above, some data writing problems have yet to be overcome. First, in a conventional writing method, the voltage drop across a resistive-type memory cell would change during a writing process, and the voltage drop across the memory cell may be so large as to overstress the memory cell and thus damage the memory cell or deteriorate the reliability of the memory cell.

Secondly, due to manufacturing processes or other factors, some of the resistive-type memory cells are fast writing memory cells (fast cell). These fast writing memory cells can be written faster than other memory cells. That is, under the same writing conditions, the fast writing memory cells complete a writing process faster than normal memory cells. In other words, the fast writing memory cells take less time to complete the writing. However, in a conventional writing method, the fast writing memory cells are not treated separately from normal memory cells, so the fast writing memory cells are subject to the same amount of writing time as normal memory cells. This may make the fast writing memory cells subject to superfluous stressing time. Namely, after completing the writing, the fast writing memory cells are subject to superfluous time of writing conditions, leading to extra stress. This may also damage the fast writing memory cells. Especially, these issues become more and more severe as semiconductor manufacturing technology advances. Therefore, an excellent method for writing resistive-type memory is desired to overcome the above issues.

In view of the issues of overstressing the fast writing memory cells and superfluous time of stressing the fast writing memory cells, this invention provides methods and circuits for self-terminated writing with quasi-constant voltage drop across resistive-type memory to solve the resistive-type memory related writing issues. The detailed description and advantages of the present invention are further set forth in the Summary and Detail Description sections. It is noted that the description set forth below is for the purpose of better understanding the present invention, not for limiting the scope of the present invention.

SUMMARY OF THE INVENTION

It is in the context of the background set forth in the previous section that this invention arises. This invention involves methods and circuits for self-terminated writing with quasi-constant voltage drop across resistive-type memory cells to solve the problem above.

In one aspect of the present invention, a method for writing with constant voltage drop across a resistive-type memory cell is provided. The method comprises: creating a writing voltage and a writing current flowing through a resistive memory cell; reproducing the writing current to generate a reproduced writing current; flowing the reproduced writing current through a dummy circuit to generate a dummy writing voltage; adding the dummy writing voltage and a reference voltage according to a ratio to generate a reference writing voltage; and adjusting the writing voltage and the writing current according to the reference writing voltage so that a voltage drop across the resistive memory cell keeps constant or slightly increases during writing.

In one aspect of the present invention, sizes of devices in the dummy circuit are adjustable so as to adjust the voltage drop across the resistive memory cell. In addition, the reference voltage is predetermined according to characteristics of the resistive memory cell.

In another aspect of the present invention, a method for self-terminated writing in a resistive-type memory cell is provided. The method comprises: creating a writing voltage and a writing current flowing through a resistive memory cell; monitoring the writing current; issuing a termination signal when the writing current reaches a predetermined target current value; and turning off related writing circuits by the termination signal so as to optimize a writing period of the resistive-type memory cell.

In one aspect of the present invention, the target current value is predetermined according to characteristics of the resistive-type memory cell.

In another aspect of the present invention, a method for self-terminated writing with constant voltage drop across resistive-type memory cell is provided. The method comprises: creating a writing current flowing through a resistive memory cell according to a predetermined reference writing voltage and creating a writing voltage; predetermining a charging or discharging rate of a reference writing voltage relative to a level of the writing voltage according to characteristics of the resistive-type memory cell; charging or discharging the reference writing voltage according to the level of writing voltage; adjusting the writing voltage and the writing current according to the reference writing voltage so that a voltage drop across the resistive-type memory cell keeps constant or slightly increases during writing; and monitoring the writing voltage, and turning off related writing circuits when the writing voltage reaches a predetermined target voltage value so as to optimize a writing period of the resistive-type memory cell.

In one aspect of the present invention, the target voltage value is predetermined according to characteristics of the resistive-type memory cell.

In one aspect of the present invention, a circuit for writing with quasi-constant voltage drop across resistive-type memory cell is provided. The circuit comprises: a resistive-type memory cell for storing data to be written, the resistive-type memory cell being a two-terminal device; a source line transistor having a drain, a source and a gate, the drain being connected to one terminal of the resistive-type memory cell, the source being connected to a power supply (VSS), wherein the power supply is in positive, ground, or negative potential, and the gate being coupled to a source line driving voltage; a word line transistor having a drain, a source and a gate, the source being connected to the other terminal of the resistive-type memory cell, and the gate being coupled to a word line driving voltage; a bit line transistor having a drain, a source and a gate, the source being connected to the drain of the word line transistor, and the gate being coupled to a bit line driving voltage; and a writing current driving transistor for providing a writing current, the writing current driving transistor having a drain, a source and a gate, the drain being connected to a positive power supply, the source being connected to the drain of the bit line transistor, and the gate being configured to receive a writing voltage. The writing current flows through a series circuit formed by the bit line transistor, the word line transistor, the resistive-type memory cell, and the source line transistor. The circuit further comprises: a writing buffer having a positive input, a negative input and an output and configured for providing the writing voltage at the output, the negative input being connected to the output to form a negative feedback, the positive input being configured to receive a reference writing voltage; a dummy source line transistor having a drain, a source and a gate, the source being connected to the power supply and the gate being coupled to the source line driving voltage; a dummy word line transistor having a drain, a source and a gate, the source being connected to the drain of the dummy source line transistor and the gate being coupled to the word line driving voltage; a dummy bit line transistor having a drain, a source and a gate, the source being connected to the drain of the dummy word line transistor and the gate being coupled to the bit line driving voltage; and a current mirror circuit having an input and an output and configured for creating a dummy writing current which is the same as the writing current, the input being configured to receive the writing voltage, the output being connected to the drain of the dummy bit line transistor. The dummy writing current flows through a dummy series circuit formed by the dummy bit line transistor, the dummy word line transistor and the dummy source line transistor, and creates a dummy writing voltage at the drain of the dummy bit line transistor. The circuit further comprises: a reference voltage generator for generating a predetermined reference voltage; and a voltage adder for receiving and processing the dummy writing voltage and the reference voltage and outputting the reference writing voltage to the positive input of the writing buffer.

In one aspect of the present invention, sizes of the dummy bit line transistor and the dummy source line transistor are adjustable to adjust the voltage drop across the resistive-type memory cell. In addition, the current mirror circuit is a transistor matching the writing current driving transistor. In addition, the reference voltage is predetermined according to characteristics of the resistive-type memory cell.

In another aspect of the present invention, a circuit for self-terminated writing in a resistive-type memory cell is provided. The circuit comprises: a resistive-type memory cell for storing data to be written, the resistive-type memory cell being a two-terminal device; a source line transistor having a drain, a source and a gate, the drain being connected to one terminal of the resistive-type memory cell, the source being connected to a power supply, and the gate being coupled to a source line driving voltage; a word line transistor having a drain, a source and a gate, the source being connected to the other terminal of the resistive-type memory cell, and the gate being coupled to a word line driving voltage; a bit line transistor having a drain, a source and a gate, the source being connected to the drain of the word line transistor, the gate being coupled to a bit line driving voltage and the drain being configured to receive a writing voltage; a writing buffer having a positive input, a negative input, an output and an enabling terminal and configured for providing the writing voltage at the output, the negative input being connected to the output to form a negative feedback, the positive input being configured to receive a reference writing voltage, the enabling terminal being configured to receive a termination signal; a reference writing voltage generator for generating a reference writing voltage; a termination voltage generator for generating a predetermined termination voltage; and a voltage comparator having a positive input, a negative input and an output and configured for providing the termination signal at the output, the positive input being configured for receiving the writing voltage output from the writing buffer, the negative input being configured for receiving the termination voltage output from the termination voltage generator, the voltage comparator comparing the writing voltage with the termination voltage, wherein, when the writing voltage is higher than the termination voltage, the termination signal is activated so as to turn off the writing buffer.

In one aspect of the present invention, the termination voltage is predetermined according to characteristics of the resistive-type memory cell.

In one aspect of the present invention, a circuit for writing with constant voltage drop across resistive-type memory cell is provided. The circuit comprises: a resistive-type memory cell for storing data to be written, the resistive-type memory cell being a two-terminal device; a source line transistor having a drain, a source and a gate, the drain being connected to one terminal of the resistive-type memory cell, the source being connected to a power supply, and the gate being coupled to a source line driving voltage; a word line transistor having a drain, a source and a gate, the source being connected to the other terminal of the resistive-type memory cell, and the gate being coupled to a word line driving voltage; a bit line transistor having a drain, a source and a gate, the source being connected to the drain of the word line transistor, and the gate being coupled to a bit line driving voltage; and a writing current driving transistor for providing a writing current, the writing current driving transistor having a drain, a source and a gate, the drain being connected to a positive power supply, the source being connected to the drain of the bit line transistor, and the gate being configured to receive a writing voltage, wherein the writing current flows through a series circuit formed by the bit line transistor, the word line transistor, the resistive-type memory cell and the source line transistor; and a writing buffer having a positive input, a negative input, an output and an enabling terminal and configured for providing the writing voltage at the output, the negative input being connected to the output to form a negative feedback, the positive input being configured to receive a reference writing voltage, the enabling terminal being configured to receive a termination signal. The circuit further comprises: a dummy source line transistor having a drain, a source and a gate, the source being connected to the power supply and the gate being coupled to the source line driving voltage; a dummy word line transistor having a drain, a source and a gate, the source being connected to the drain of the dummy source line transistor and the gate being coupled to the word line driving voltage; a dummy bit line transistor having a drain, a source and a gate, the source being connected to the drain of the dummy word line transistor and the gate being coupled to the bit line driving voltage; and a current mirror circuit having an input and an output and configured for creating a dummy writing current which is the same as the writing current, the input being configured to receive the writing voltage, the output being connected to the drain of the dummy bit line transistor, wherein the dummy writing current flows through a dummy series circuit formed by the dummy bit line transistor, the dummy word line transistor and the dummy source line transistor and creates the dummy writing voltage at the drain of the dummy bit line transistor. The circuit further comprises: a reference voltage generator for generating a predetermined reference voltage; a voltage adder for receiving and processing the dummy writing voltage and the reference voltage and for outputting the reference writing voltage to the positive input of the writing buffer; a termination voltage generator for generating a predetermined termination voltage; and a voltage comparator having a positive input, a negative input and an output and configured for providing the termination signal at the output, the positive input being configured to receive the writing voltage output from the writing buffer, the negative input being configured to receive the termination voltage output from the termination voltage generator, the voltage comparator comparing the writing voltage with the termination voltage, wherein, when the writing voltage is higher than the termination voltage, the termination signal is activated so as to turn off the writing buffer.

In another aspect of the present invention, a circuit for self-terminated writing with quasi-constant voltage drop across resistive-type memory cell is provided. The circuit comprises: a resistive-type memory cell for storing data to be written, the resistive-type memory cell being a two-terminal device; a source line transistor having a drain, a source and a gate, the drain being connected to one terminal of the resistive-type memory cell, the source being connected to a power supply, and the gate being coupled to a source line driving voltage; a word line transistor having a drain, a source and a gate, the source being connected to the other terminal of the resistive-type memory cell, and the gate being coupled to a word line driving voltage; a bit line transistor having a drain, a source and a gate, the source being connected to a drain of the word line transistor, and the gate being coupled to a bit line driving voltage; and a writing current driving transistor for providing a writing current, the writing current driving transistor having a drain, a source and a gate, the drain being connected to a high voltage terminal, the source being connected to the drain of the bit line transistor, and the gate being configured to receive a reference writing voltage, wherein the writing current flows through a series circuit formed by the bit line transistor, the word line transistor, the resistive-type memory cell and the source line transistor to generate a writing voltage at the drain of the bit line transistor; a reference writing voltage generator for generating the reference writing voltage; a reference writing voltage capacitor with one terminal thereof connected to the power supply and the other terminal thereof coupled to the reference writing voltage; and a charge processing circuit having an input and an output and configured for regulating the reference writing voltage, the input being configured to receive the writing voltage, the output being coupled to the reference writing voltage.

In one aspect of the present invention, a size of the charge processing circuit is predetermined according to characteristics of the resistive-type memory cell.

In one aspect of the present invention, the charge processing circuit is a discharging circuit and the writing current driving transistor is a N-channel MOS (metal oxide semiconductor) FET (field effect transistor).

In one aspect of the present invention, the charge processing circuit is a charging circuit and the writing current driving transistor is a P-channel MOS FET.

From the description set forth above, it is apparent that the present invention has advantages to keep a constant voltage drop across the memory cell so as to prevent overstressing the memory cell from during the writing period, and can achieve self-terminated writing mechanism so as to avoid the writing period of the fast writing memory cells from being too long, thereby preventing damage to the resistive-type memory cell, enhancing the endurance of the resistive-type memory cell, shortening the writing operation time of the memory cell and reducing cost.

BRIEF DESCRIPTION OF THE DRAWINGS

The embodiments of the present invention now are described by examples in a non-limiting way. The features and benefits of the present invention may best be understood by reference to the following description taken in conjunction with the accompanying drawings, wherein:

FIG. 1B schematically shows a graph illustrating the writing current/resistance versus time in a conventional method for writing resistive-type memory.

FIG. 1C schematically shows a graph illustrating the writing voltage versus time in a conventional method for writing resistive-type memory.

FIG. 1D schematically shows a graph illustrating the writing current/resistance versus time in a conventional method for fast writing resistive-type memory.

DETAILED DESCRIPTION

Figure 1A:
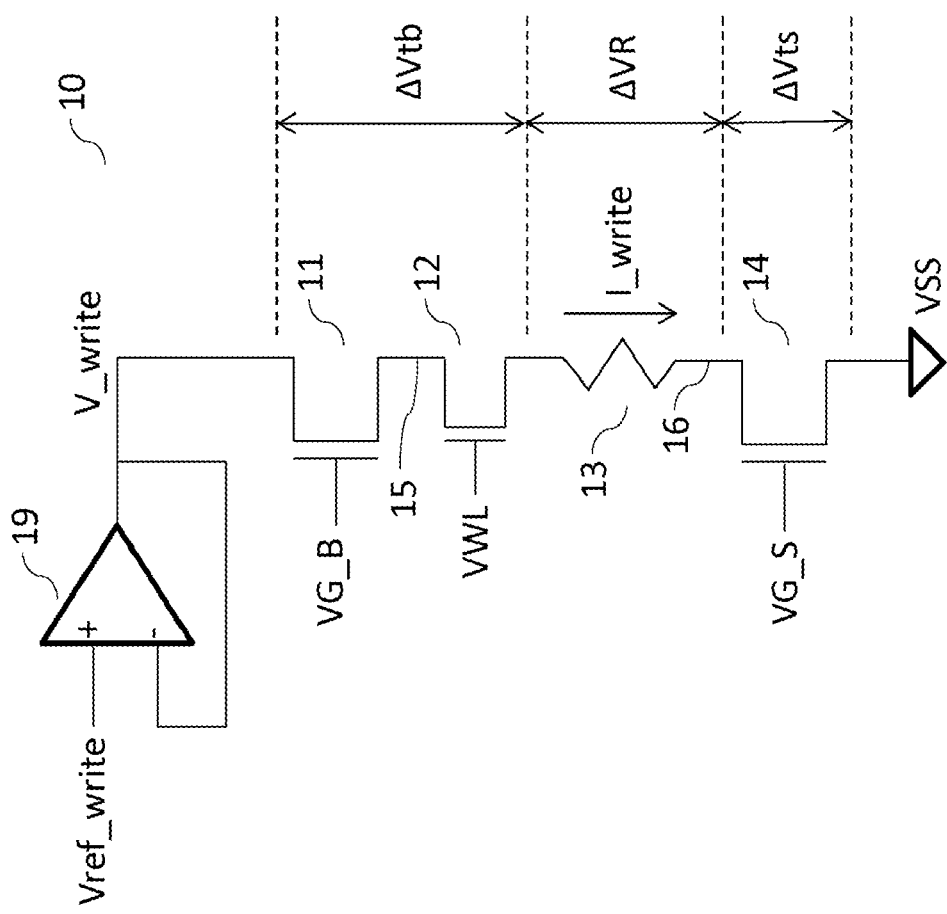
FIG. 1A shows a schematic view of a portion of a conventional circuit for writing resistive-type memory.

Now please refer to FIG. 1A, which shows a schematic view of a portion of a conventional circuit for writing a resistive-type memory. A conventional circuit 10 for writing a resistive-type memory comprises a writing buffer 19, a transistor 11, a transistor 12, a transistor 14, and a resistive-type memory cell 13. One of the two terminals of the resistive-type memory cell 13 is connected to the drain of the transistor 14 while the other of the two terminals is connected to the source of the transistor 12. The source of the transistor 14 is connected to a power supply (VSS) while the gate of the transistor 14 is coupled to a voltage VG_S. The drain of the transistor 12 is connected to the source of the transistor 11 while the gate of the transistor 12 is coupled to a voltage VWL. The drain of the transistor 11 is connected to the output of the writing buffer 19 while the gate of the transistor 11 is coupled to a voltage VG_B. The resistive-type memory cell 13 is connected to the transistor 14 through a local source line 16. The transistor 12 is connected to the transistor 11 through a local bit line 15. Furthermore, the output of the writing buffer 19 feeds back to its negative input and a reference writing voltage Vref_write is input to the positive input of the writing buffer 19, thereby creating a writing voltage V_write at the output of the writing buffer 19. The reference writing voltage Vref_write may be provided by a reference voltage generator (not shown).

In FIG. 1A, the writing current I_write flows through a series circuit formed by the transistor 11, the transistor 12, the resistive-type memory cell 13, and the transistor 14. In addition, the voltage across the resistive-type memory cell 13 is denoted as $\Delta VR$, the voltage across the transistor 14 is denoted as $\Delta Vts$, and the voltage across a series circuit formed by the transistor 11 and the transistor 12 is denoted as $\Delta Vtb$.

Now please refer to FIGS. 1B and 1C, which schematically show graphs illustrating the writing current/resistance versus time and the writing voltage versus time in a conventional method for writing resistive-type memory. FIG. 1B shows that during a writing operation the resistance Rcell of the resistive-type memory cell 13 increases over time. As a result, the writing current I_write decreases over time. On the other hand, FIG. 1C shows that the writing voltage V_write substantially keeps constant (approximately the same as the reference writing voltage Vref_write) during the writing operation, so the voltage drop $\Delta VR$ increases as the resistance Rcell of the resistive-type memory cell 13 increases while the voltage drops $\Delta Vtb$ and $\Delta Vts$ decrease gradually. This may cause the voltage drop $\Delta VR$ to exceed the withstand voltage of the resistive-type memory cell 13, which overstresses the resistive-type memory cell 13 and may damage the memory cell.

Now please refer to FIG. 1D, which schematically shows a graph illustrating the writing current/resistance versus time in a conventional method for writing resistive-type memory. In the conventional method for writing resistive-type memory, all of the resistive-type memory cells 13 are subject to the same writing conditions (such as the same writing voltage and writing current) until completion of a predetermined period of writing time. However, for fast writing memory cells, because they reach target resistance faster than other memory cells, the fast writing memory cells are subject to superfluous stressing time, as shown in FIG. 1D, after reaching target resistance. Similarly, stressing for a too long time may damage the resistive-type memory cell 13.

In view of the issues encountered by the conventional method for writing resistive-type memory, the present invention provides the following methods to solve these problems. First, in order to solve the issue of increasing voltage drop $\Delta VR$ during the writing operation, a method is provided, which involves detecting the writing current thereby adjusting the writing voltage so as to keep the voltage drop $\Delta VR$ across the resistive-type memory cell at a substantially constant level. Secondly, in order to solve the issue of superfluous stressing time, a method is provided, which involves detecting the writing current or the writing voltage, thereby determining whether the resistance of the resistive-type memory cell reaches a target resistance value so as to terminate the writing process. In the description below, specific embodiments of methods and circuits for writing resistive-type memory according to the present invention are explained in detail. It should be noted that the embodiments explained and described below are illustrative and exemplary and not for limiting the scope of the claims of the present invention.

Figure 2:
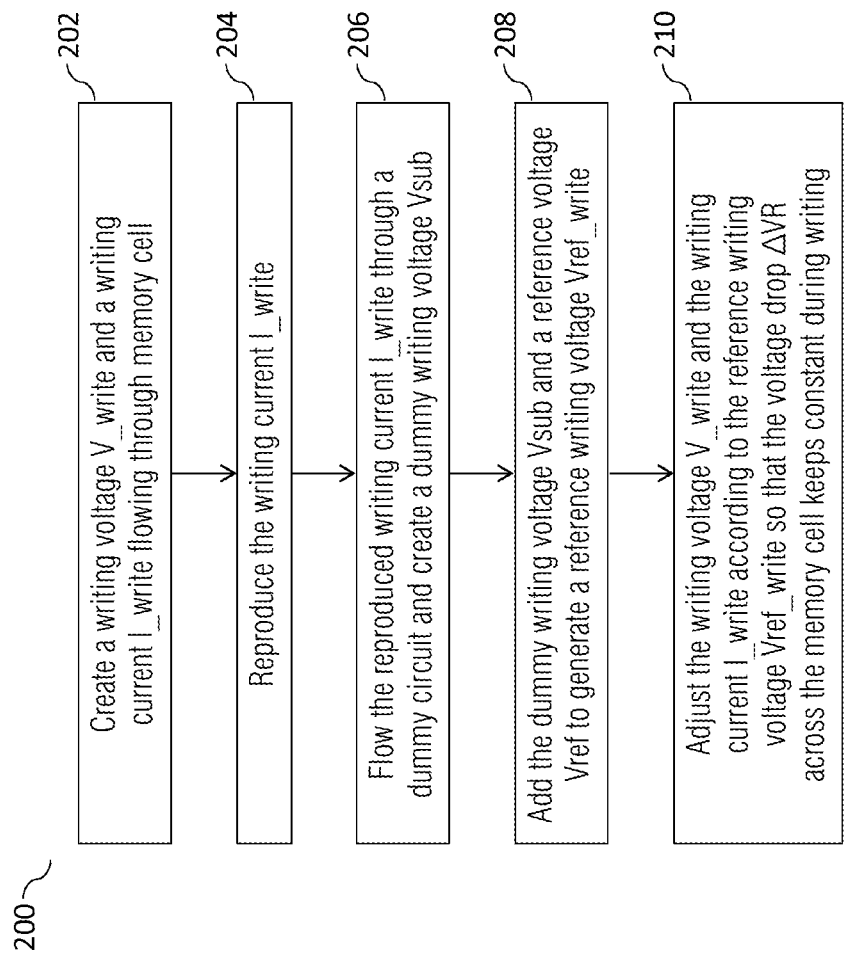
FIG. 2 schematically shows a flow chart illustrating a method for writing with quasi-constant voltage drop across resistive-type memory cell according to one embodiment of the present invention.

Now refer to FIG. 2, which schematically shows a flow chart illustrating a method for writing with quasi-constant voltage drop across a resistive-type memory cell according to one embodiment of the present invention. In a method 200 for writing with quasi-constant voltage drop across a resistive-type memory cell, first, the writing voltage V_write and a writing current I_write flowing through the memory cell are created (step 202). Then, the writing current I_write is reproduced (step 204) so that the reproduced writing current I_write can flow through a dummy circuit to create a dummy writing voltage Vsub (step 206). For example, a current mirror circuit may be used for reproducing the writing current I_write and the reproduced writing current may flow through a dummy circuit having a structure similar to a memory array to generate a dummy writing voltage Vsub. After that, the dummy writing voltage Vsub and a reference voltage Vref are added together to generate a reference writing voltage Vref_write (step 208). Next, the writing voltage V_write and the writing current I_write are adjusted according to the reference writing voltage Vref_write, so that the voltage drop $\Delta VR$ across the resistive-type memory cell can keep constant or only slightly increase during the writing operation (step 210). In addition, in the method 200, the level of the reference voltage Vref can also be predetermined according to characteristics of the resistive-type memory cell. By doing so, the reference writing voltage Vref_write can be correlated to the voltage drop ΔVR across the resistive-type memory cell (for example, Vref_write=ΔVR+Vsub).

Figure 3:
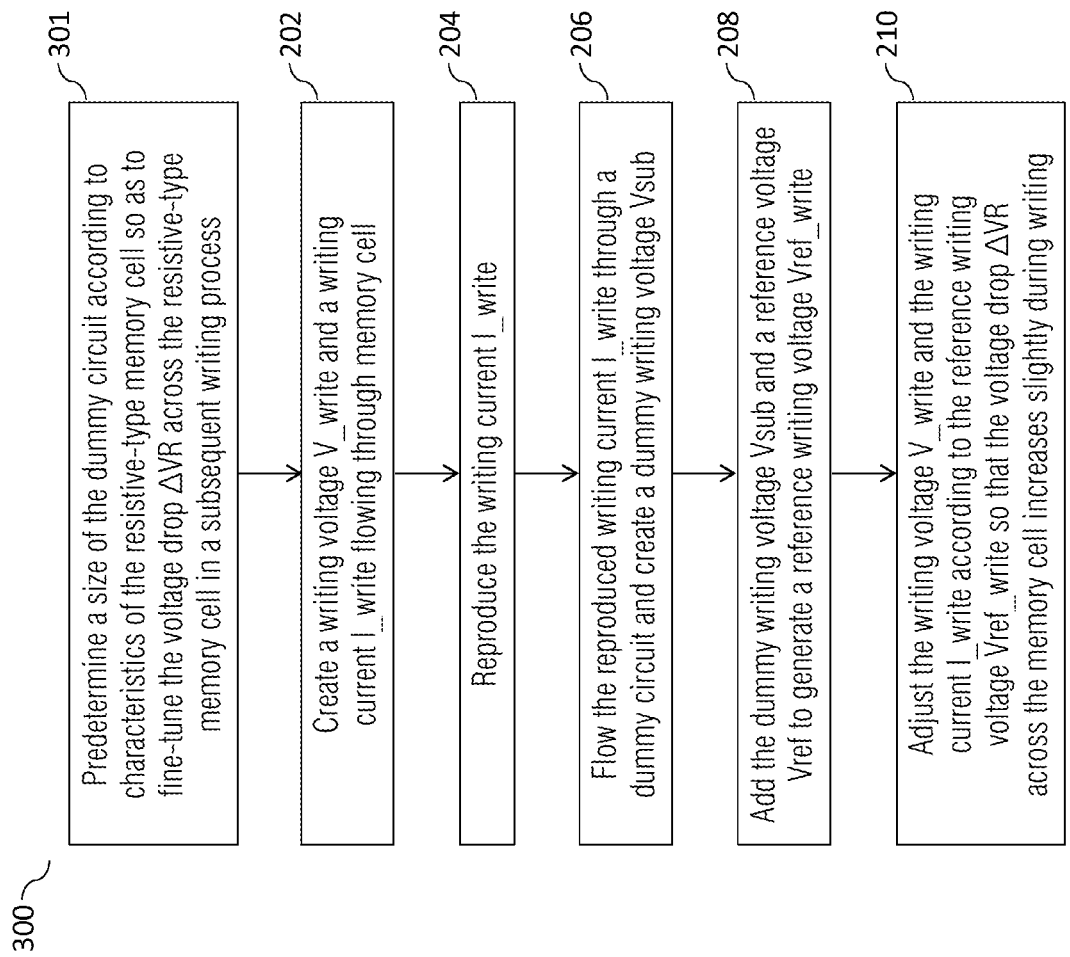
FIG. 3 schematically shows a flow chart illustrating a method for writing with fine-tuned voltage drop across resistive-type memory cell according to another embodiment of the present invention.

On the other hand, in a semiconductor process, characteristics of the resistive-type memory cells on each wafer may vary due to variation of process conditions. Therefore, in one embodiment of the present invention, a size of the dummy circuit can be pre-adjusted so as to optimize the writing process with respect to differences in characteristics of the resistive-type memory cell. Now refer to FIG. 3, which schematically shows a flow chart illustrating a method for writing with fine-tuned voltage drop across a resistive-type memory cell according to another embodiment of the present invention. In a method 300 for writing with quasi-constant voltage drop across the resistive-type memory cell, a size of the dummy circuit is predetermined according to characteristics of the resistive-type memory cell (step 301), so that the voltage drop across the resistive-type memory cell can be fine-tuned in the subsequent writing process. Then, the method proceeds with the steps 202-210 of the method 200 as shown in FIG. 2. In this method 300, the predetermined size of the dummy circuit reflects different characteristics of the resistive-type memory cells (characteristics of the resistive-type memory cells on each wafer may vary due to process conditions). By doing so, a size of the dummy circuit can be predetermined according to characteristics of the resistive-type memory cell, so as to adjust the dummy writing voltage Vsub and thus fine-tune the voltage drop ΔVR across the resistive-type memory cell, thereby optimizing the writing process.

Figure 4:
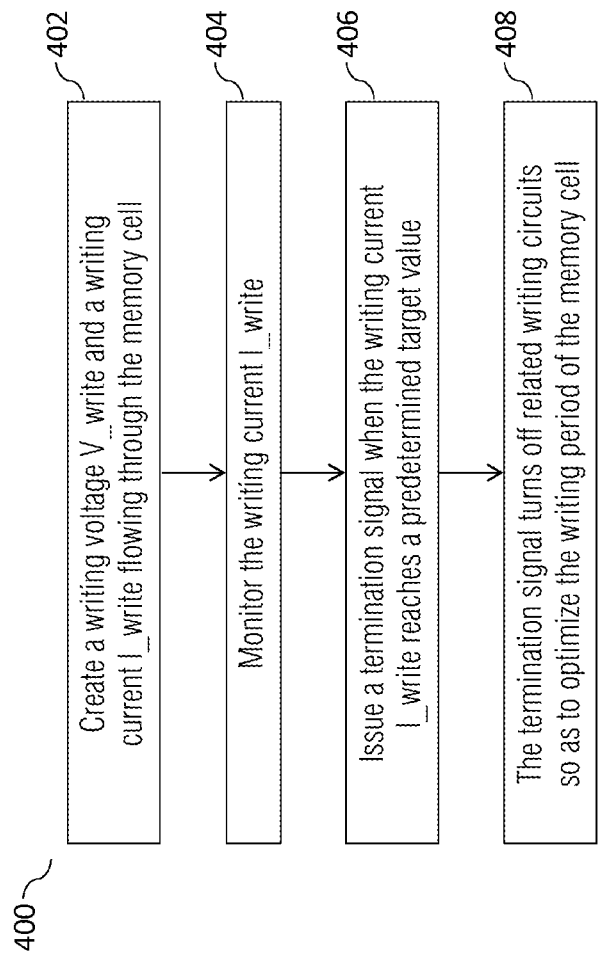
FIG. 4 schematically shows a flow chart illustrating a method for self-terminated writing in a resistive-type memory cell according to another embodiment of the present invention.

Now refer to FIG. 4, which schematically shows a flow chart illustrating a method for self-terminated writing in a resistive-type memory cell according to another embodiment of the present invention. In a method 400 for self-terminated writing in a resistive-type memory cell, first, a writing voltage V_write and a writing current I_write flowing through the memory cell are created (step 402). Then, the writing current I_write is monitored (step 404). A termination signal is issued when the writing current I_write reaches a predetermined target value (step 406). Next, the termination signal shuts down related writing circuits so as to optimize the writing period of the resistive-type memory cell (step 408). In this method 400, determining whether an expected writing state of the resistive-type memory is achieved by monitoring the writing current I_write. When the writing current I_write reaches the target value and thus indicates that the expected writing state of the resistive-type memory cell is achieved, the termination signal is issued to stop the writing process. By doing so, self-terminated writing in resistive-type memory cell can be achieved so as to avoid overstressing the resistive-type memory cell.

In an alternative embodiment, instead of monitoring the writing current I_write, the writing voltage V_write is monitored. In addition, the target current value (or target voltage value) can be predetermined according to characteristics of the resistive-type memory cell so as to optimize the writing process.

In addition, according to another embodiment of the present invention, the writing method with quasi-constant voltage drop and the method for self-terminated writing set forth above can be combined properly to simultaneously achieve the purpose of keeping the voltage drop ΔVR across the resistive-type memory cell at a constant or slightly increased level during the writing process and the purpose of preventing overstressing the resistive-type memory cell.

Figure 5:
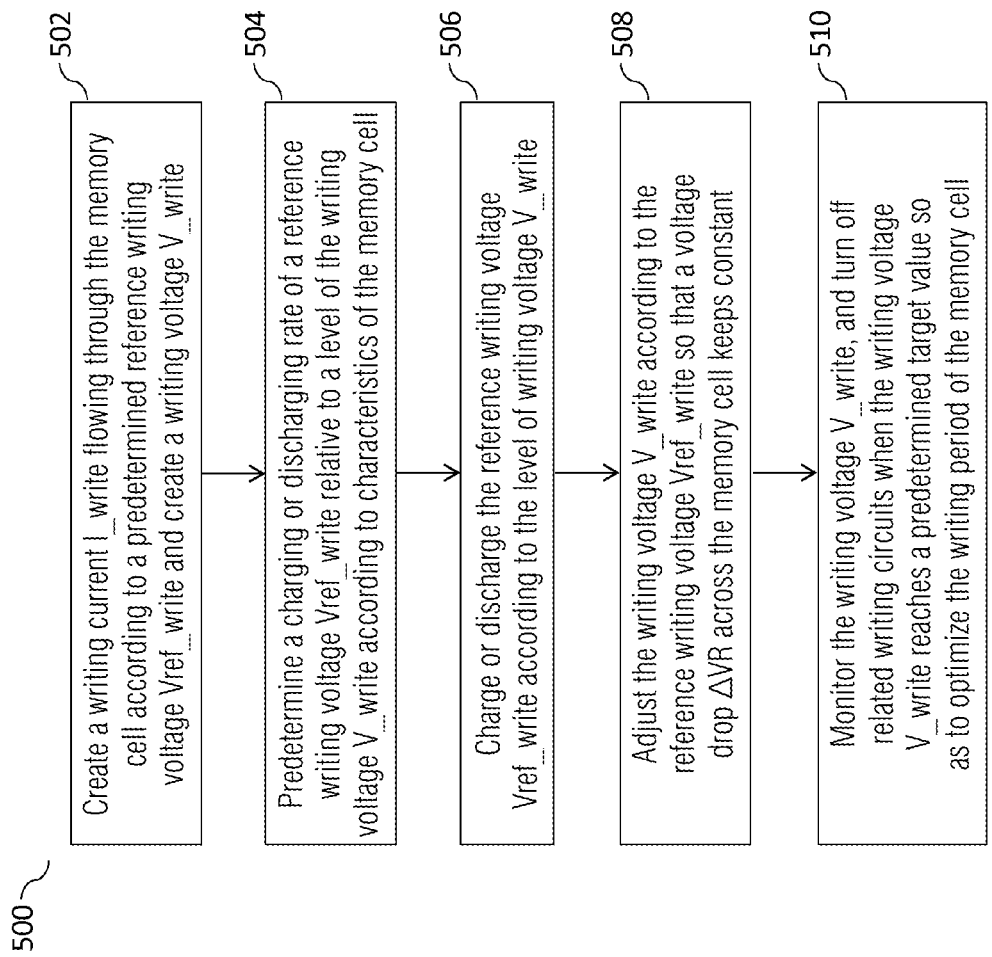
FIG. 5 schematically shows a flow chart illustrating a method for self-terminated writing with quasi-constant voltage drop across resistive-type memory cell according to another embodiment of the present invention.

Now refer to FIG. 5, which schematically shows a flow chart illustrating a method for self-terminated writing with quasi-constant voltage drop across a resistive-type memory cell according to another embodiment of the present invention. In a method 500 for self-terminated writing with quasi-constant voltage drop across resistive-type memory cell, a writing current I_write flowing through the resistive-type memory cell is created according to a predetermined reference writing voltage Vref_write, and a writing voltage V_write is created (step 502). A charging or discharging rate of a reference writing voltage Vref_write relative to a level of the writing voltage V_write can be predetermined according to characteristics of the resistive-type memory cell (step 504). Then, the reference writing voltage Vref_write is charged or discharged according to the level of the writing voltage V_write (step 506). Next, the writing voltage V_write is adjusted according to the reference writing voltage Vref_write, so that a voltage drop ΔVR across the resistive-type memory cell can keep constant or only slightly increase during the writing process (step 508). After that, the writing voltage V_write is monitored, and when the writing voltage V_write reaches a predetermined target value, related writing circuits are shut down so as to optimize the writing period of the resistive-type memory cell (step 510). The method 500 can achieve the purposes of the method for writing with quasi-constant voltage drop and the self-terminated method. Due to lack of dummy circuits, the method 500 can be achieved at relatively low cost.

The circuits corresponding to the methods set forth above are described below. Even though the circuits described below can be utilized to implement the methods set forth above, it is understood that the method set forth above can be implemented in other ways.

Figure 6:
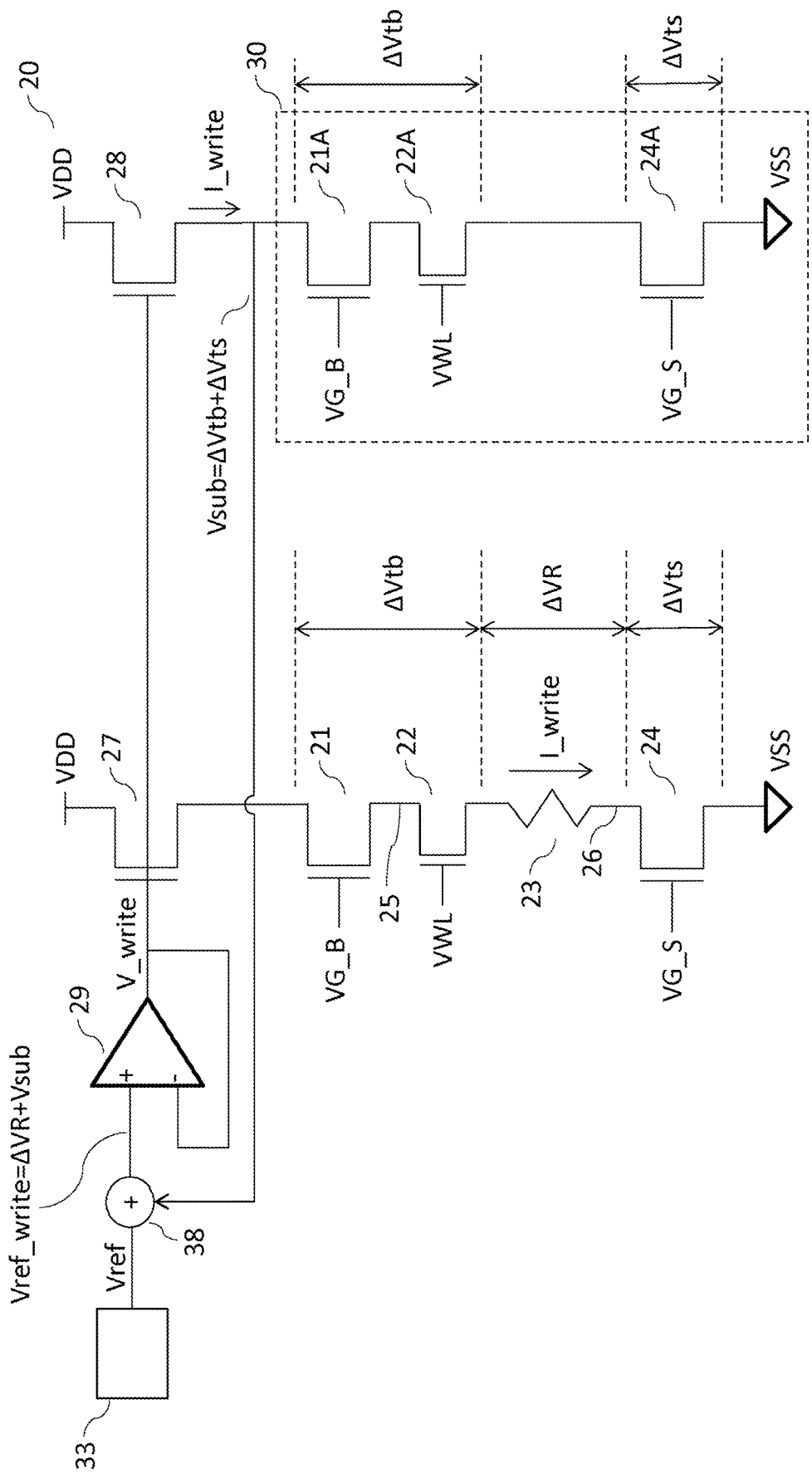
FIG. 6 shows a schematic view illustrating a circuit for writing with quasi-constant voltage drop across resistive-type memory cell according to one embodiment of the present invention.

Now refer to FIG. 6, which shows a schematic view illustrating a circuit for writing with quasi-constant voltage drop across a resistive-type memory cell (corresponding to the method shown in FIG. 2) according to one embodiment of the present invention. The circuit 20 for writing with quasi-constant voltage drop across a resistive-type memory cell comprises a resistive-type memory cell 23, a source line transistor 24, a word line transistor 22, a bit line transistor 21 and a writing current driving transistor 27. The resistive-type memory cell 23 is configured to store the data to be written and is a two-terminal device. The drain of the source line transistor 24 is connected to one terminal of the resistive-type memory cell 23 (here the connection is referred to as local source line 26). The source of the source line transistor 24 is connected to the power supply (VSS), and the gate of the source line transistor 24 is coupled to the source line driving voltage VG_S. The source of the word line transistor 22 is connected to the other terminal of the resistive-type memory cell 23 and the gate of the word line transistor 22 is coupled to the word line driving voltage VWL. The source of the bit line transistor 21 is connected to the drain of the word line transistor 22 (here the connection is referred to as local bit line 25), and the gate of the bit line transistor 21 is coupled to the bit line driving voltage VG_B. The writing current driving transistor 27 is configured to provide the writing current I_write. The drain of the writing current driving transistor 27 is connected to the positive power supply (VDD), the source of the writing current driving transistor 27 is connected to the drain of the bit line transistor 21, and the gate of the writing current driving transistor 27 is coupled to the writing voltage V_write. The writing current I_write flows through a series circuit formed by the bit line transistor 21, the word line transistor 22, the resistive-type memory cell 23 and the source line transistor 24.

In addition, the circuit 20 for writing with quasi-constant voltage drop across the resistive-type memory cell can further comprise a current mirror circuit 28, a dummy source line transistor 24A, a dummy word line transistor 22A and a dummy bit line transistor 21A. The source of the dummy source line transistor 24A is connected to the power supply, the gate of the dummy source line transistor 24A is coupled to the source line driving voltage VG_S. The source of the dummy word line transistor 22A is connected to the drain of the dummy source line transistor 24A, and the gate of the dummy word line transistor 22A is coupled to the word line driving voltage VWL. The source of the dummy bit line transistor 21A is connected to the drain of the dummy word line transistor 22A, and the gate of the dummy bit line transistor 21A is coupled to the bit line driving voltage VG_B. The current mirror circuit 28 has an input and an output, and is configured to create a dummy writing current which is the same as the writing current I_write. The input of the current mirror circuit 28 is configured to receive the writing voltage V_write, and the output of the current mirror circuit 28 is connected to the drain of the dummy bit line transistor 21A. In addition, the dummy writing current flows through a dummy series circuit 30 formed by the dummy bit line transistor 21A, the dummy word line transistor 22A and the dummy source line transistor 24A, and creates the dummy writing voltage Vsub at the drain of the dummy bit line transistor 21A.

In addition, the circuit 20 for writing with quasi-constant voltage drop across resistive-type memory cell can further comprise a writing buffer 29, a reference voltage generator 33, and a voltage adder 38. The writing buffer 29 has a positive input, a negative input, and an output, and can be configured to provide the writing voltage V_write at its output. The negative input of the writing buffer 29 is connected to its output to form a negative feedback, and the positive input of the writing buffer 29 is configured to receive a reference writing voltage Vref_write. The reference voltage generator 33 is configured to generate a predetermined reference voltage Vref. The voltage adder 38 can be configured to receive and process the dummy writing voltage Vsub and the reference voltage Vref, so as to output the reference writing voltage Vref_write to the positive input of the writing buffer 29.

In the circuit 20 for writing with quasi-constant voltage drop across the resistive-type memory cell, the writing current driving transistor 27 provides the writing current I_write. The writing current I_write flows through a series circuit formed by the bit line transistor 21, the word line transistor 22, the resistive-type memory cell 23 and the source line transistor 24, so as to create voltage drop ΔVR across the resistive-type memory cell 23, voltage drop ΔVts between the drain and the source of the source line transistor 24, and voltage drop ΔVtb between the drain of the bit line transistor 21 and the source of the word line transistor 22. On the other hand, the current mirror circuit 28 creates the dummy writing current which is the same as the writing current I_write. The dummy writing current flows through the dummy series circuit 30 formed by the dummy bit line transistor 21A, the dummy word line transistor 22A and the dummy source line transistor 24A, and similarly creates a voltage drop ΔVts between the drain and the source of the dummy source line transistor 24A, voltage drop ΔVtb between the drain of the dummy bit line transistor 21A and the source of the dummy word line transistor 22A, and the dummy writing voltage Vsub at the drain of the dummy bit line transistor 21A. Furthermore, the dummy writing voltage Vsub is equivalent to the sum of the voltage drop ΔVtb and the voltage drop ΔVts (Vsub=ΔVtb+ΔVts).

Then, the voltage adder 38 is utilized to process the dummy writing voltage Vsub generated by the dummy series circuit 30 and the reference voltage Vref generated by the voltage generator 33, so as to create the reference writing voltage Vref_write (Vref_write=ΔVR+Vsub). The positive input of the writing buffer 29 receives the reference writing voltage Vref_write, wherein the negative input and the output of the writing buffer 29 are connected to form a negative feedback. The writing buffer 29 provides, at its output, the writing voltage V_write to the writing current driving transistor 27 and the current mirror circuit 28. By such arrangement, the reference writing voltage Vref_write can be adjusted according to the variation of the resistance Rcell of the resistive-type memory cell 23 during a writing process, thereby adjusting the writing voltage V_write (V_write=Vref_write). Subsequently, with the adjustment of the writing voltage V_write, the voltage drops ΔVtb and ΔVts are decreased, so that the voltage drop ΔVR across the resistive-type memory cell 23 can keep constant or only increase slightly.

Figure 7:
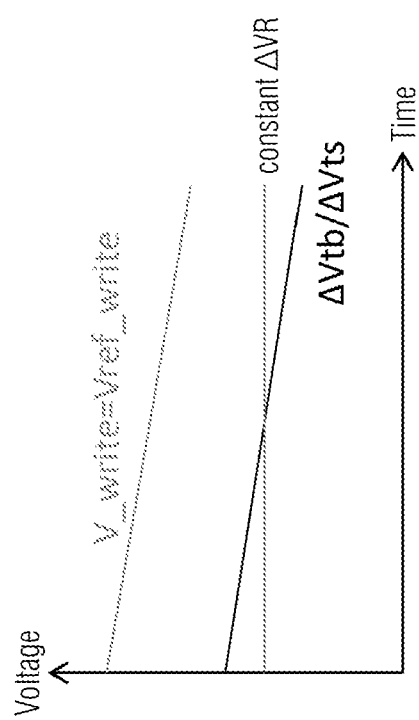
FIG. 7 schematically shows a graph illustrating the writing voltage versus time of a method for writing with quasi-constant voltage drop across resistive-type memory cell according to one embodiment of the present invention.

For example, as shown by FIG. 7, by using the method set forth above, the writing voltage V_write may decrease with increase of resistance Rcell of the resistive-type memory cell 23 so that the voltage drops ΔVtb and ΔVts can decrease. As a result the voltage drop ΔVR across the resistive-type memory cell 23 can keep constant or only increase slightly.

Figure 8:
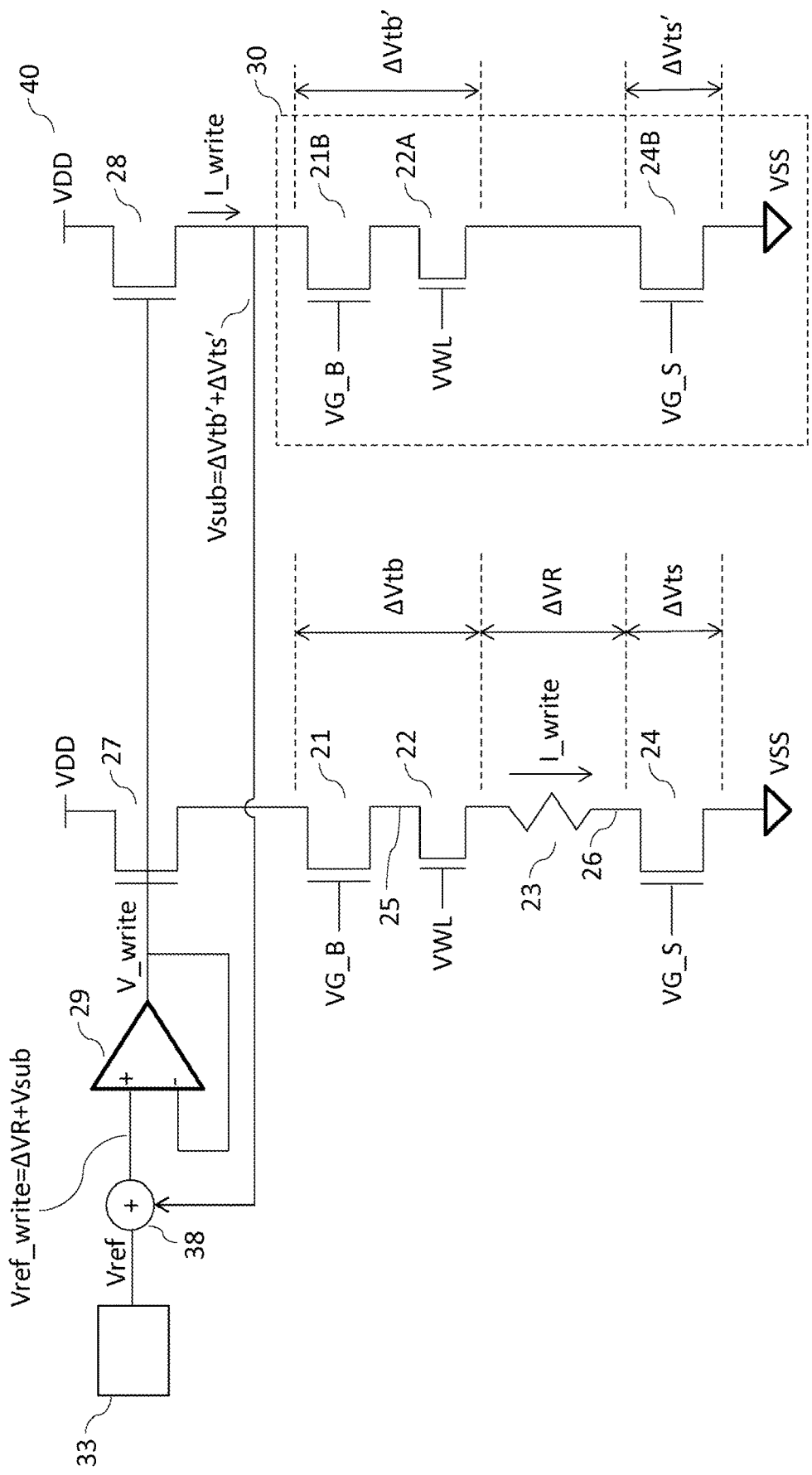
FIG. 8 shows a schematic view illustrating a circuit for writing with quasi-constant voltage drop across resistive-type memory cell according to another embodiment of the present invention.

On the other hand, during manufacturing semiconductor devices, characteristics of the resistive-type memory cells on each wafer may vary due to variation of process conditions. Therefore, in one embodiment of the present invention, sizes of the dummy bit line transistor and the dummy source line transistor are configured to be adjustable, in order to achieve optimization with respect to the difference in the characteristics. For example, FIG. 8 shows a schematic view illustrating a circuit 40 for writing with quasi-constant voltage drop across resistive-type memory cell according to another embodiment of the present invention (corresponding to the method shown in FIG. 3). The circuit 40 for writing with quasi-constant voltage drop across a resistive-type memory cell is substantially the same as the circuit 20 for writing with quasi-constant voltage drop shown in FIG. 6, except that, in the circuit 40 for writing with quasi-constant voltage drop across the resistive-type memory cell, the sizes of the dummy bit line transistor 21B and the dummy source line transistor 24B are configured to be adjustable in order to facilitate fine-tuning the voltage drop ΔVR across the resistive-type memory cell during a subsequent writing process. The current mirror circuit 28 creates a dummy writing current which is the same as the writing current I_write. The dummy writing current flows through a dummy series circuit 30 formed by the dummy bit line transistor 21B, the dummy word line transistor 22A and the dummy source line transistor 24B, and creates a voltage drop ΔVts' between the drain and the source of the dummy source line transistor 24B, voltage drop ΔVtb' between the drain of the dummy bit line transistor 21B and the source of the dummy word line transistor 22A, and a dummy writing voltage Vsub at the drain of the dummy bit line transistor 21B. Furthermore, the dummy writing voltage Vsub is equivalent to the sum of the voltage drop ΔVtb' and the voltage drop ΔVts' (Vsub=ΔVtb'+ΔVts'). By such arrangement, the sizes of the dummy bit line transistor 21B and the dummy source line transistor 24B can be pre-adjusted according to characteristics of the resistive-type memory cell on each wafer so as to adjust the voltage drop ΔVR during a writing process. Hence, the voltage drop ΔVR during a writing process can be fine-tuned according to characteristics of the resistive-type memory cell, so as to optimize the writing process and avoid overstressing the resistive-type memory cell.

In one embodiment of the present invention, the current mirror circuit 28 can be a transistor matching the writing current driving transistor 27. In addition, the reference voltage Vref may be predetermined according to characteristics of the resistive-type memory cells 23 on each wafer.

From the description above, the circuits for writing with constant voltage drop across a resistive-type memory cell have the following advantages: the voltage drop across the resistive-type memory cell can keep constant or only increase slightly so as to prevent overstressing the resistive-type memory cell.

Figure 9:
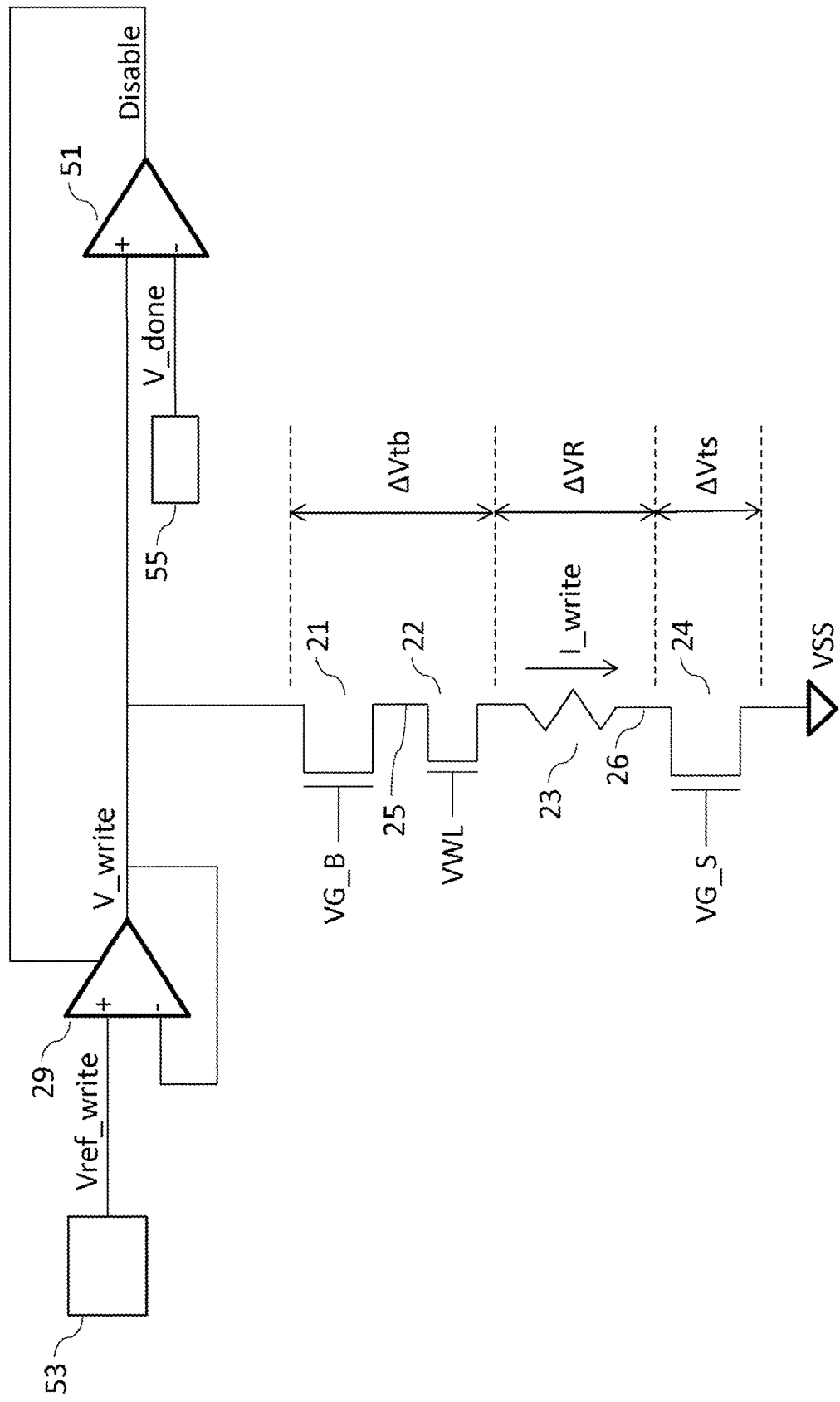
FIG. 9 shows a schematic view illustrating a circuit for self-terminated writing resistive-type memory cell according to another embodiment of the present invention.

Now refer to FIG. 9, which shows a schematic view illustrating a circuit 50 for self-terminated writing in a resistive-type memory cell according to another embodiment of the present invention (corresponding to the method shown in FIG. 4). The circuit 50 for self-terminated writing in the resistive-type memory cell can comprise a resistive-type memory cell 23, a source line transistor 24, a word line transistor 22, and a bit line transistor 21. A series circuit formed by the bit line transistor 21, the word line transistor 22, the resistive-type memory cell 23 and the source line transistor 24 has a structure the same as that of the series circuit formed in the embodiment of FIG. 6, and thus detailed description thereof is omitted.

In addition, the circuit 50 for self-terminated writing in a resistive-type memory cell can further comprises a reference writing voltage generator 53, a termination voltage generator 55, a writing buffer 29 and a voltage comparator 51. The reference writing voltage generator 53 can be configured to generate a reference writing voltage Vref_write. The termination voltage generator 55 can be configured to generate a predetermined termination voltage V_done. The writing buffer 29 has a positive input, a negative input, an output and an enabling terminal, and can be configured to provide a writing voltage V_write at its output. The positive input of the writing buffer 29 receives the reference writing voltage Vref_write and the enabling terminal of the writing buffer 29 receives a termination signal (Disable), wherein the negative input and the output of the writing buffer 29 are connected to form a negative feedback. The writing buffer 29 can also be configured to provide a writing current I_write. The writing current I_write flows through a series circuit formed by the bit line transistor 21, the word line transistor 22, the resistive-type memory cell 23 and the source line transistor 24. The voltage comparator 51 has a positive input, a negative input and an output, and can be configured to provide, at its output, the termination signal (Disable) to the enabling terminal of the writing buffer 29. The positive input of the voltage comparator 51 receives the writing voltage V_write output from the writing buffer 29, and the negative input of the voltage comparator 51 receives the termination voltage V_done output from the termination voltage generator 55. In addition, the voltage comparator 51 can be also configured to compare the writing voltage V_write with the termination voltage V_done. If the writing voltage V_write is higher than the termination voltage V_done, the termination signal (Disable) is activated to turn off the writing buffer 29. By the arrangement above, the writing process is self-terminated after the resistance Rcell of the resistive-type memory cell 23 reaches a target value.

In one embodiment of the present invention, the reference writing voltage Vref_write and the voltage termination voltage V_done can be predetermined according to characteristics of the resistive-type memory cells 23 on each wafer.

From the description above, the circuits for self-terminated writing in resistive-type memory cell can have the following advantages: the writing process is self-terminated after the resistance of the resistive-type memory cell reaches a target value so as to prevent superfluous time of stressing the resistive-type memory cell.

Furthermore, according to another embodiment of the present invention, the circuit 20 for writing with quasi-constant voltage drop (or the circuit 40 for writing with quasi-constant voltage drop) and the circuit 50 for self-terminated writing set forth above can be combined properly into a circuit for self-terminated writing with quasi-constant voltage drop across a resistive-type memory cell. The combined circuit can simultaneously achieve the purpose of preventing overstressing the resistive-type memory cell and the purpose of preventing superfluous time of stressing the resistive-type memory cell.

Figure 10A:
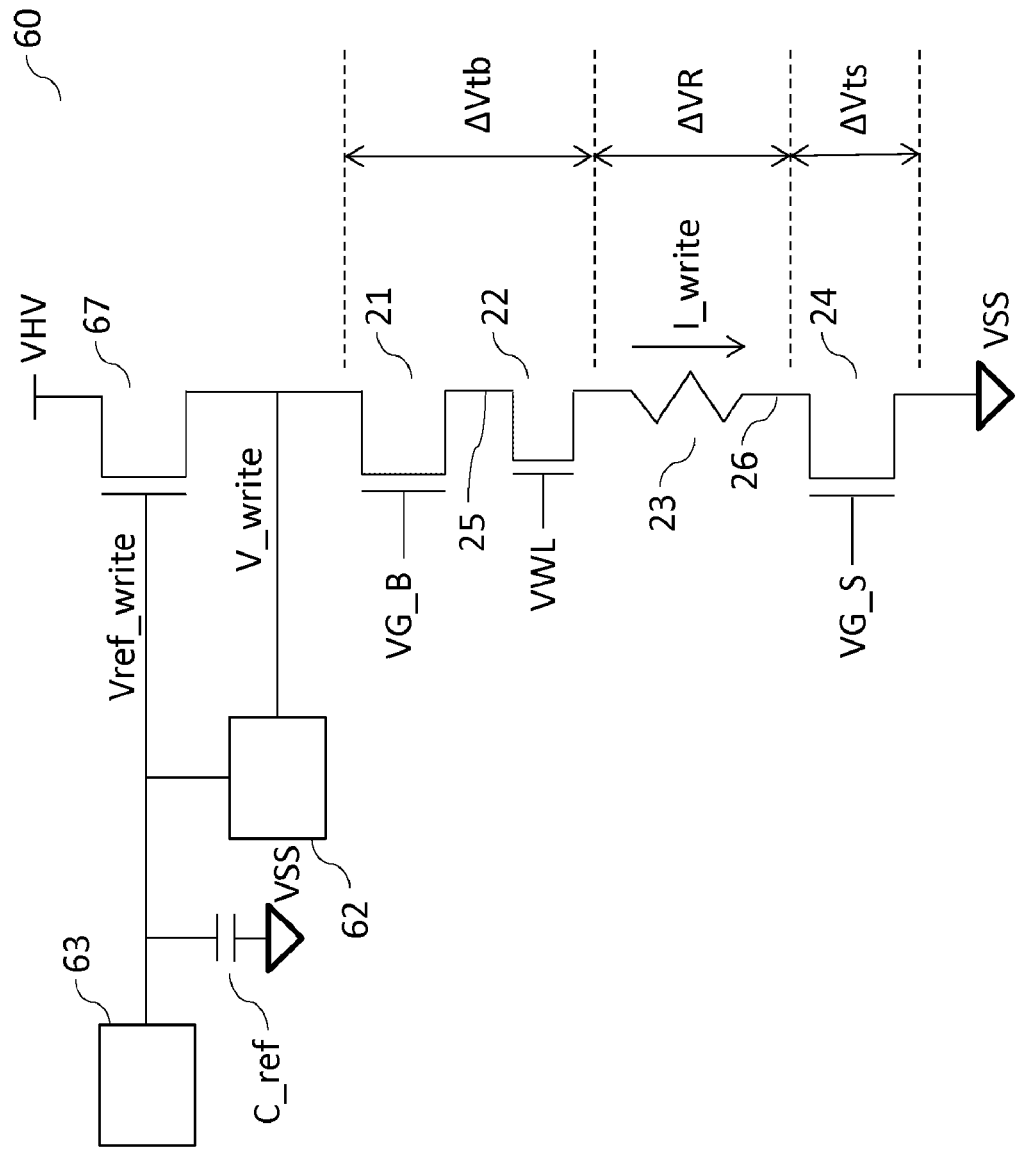
FIG. 10A shows a schematic view illustrating a circuit for self-terminated writing with quasi-constant voltage drop across resistive-type memory cell according to another embodiment of the present invention.

Now refer to FIG. 10A, which shows a schematic view illustrating a circuit 60 for self-terminated writing with quasi-constant voltage drop across a resistive-type memory cell according to another embodiment of the present invention (corresponding to the method shown in FIG. 5). A circuit 60 for self-terminated writing with quasi-constant voltage drop across a resistive-type memory cell can comprise a resistive-type memory cell 23, a source line transistor 24, a word line transistor 22, a bit line transistor 21, and a writing current driving transistor 67. A series circuit formed by the bit line transistor 21, the word line transistor 22, the resistive-type memory cell 23, and the source line transistor 24 is the same as the series circuit of the embodiment in FIG. 6, so the detailed description is omitted. The writing current driving transistor 67 can be configured to provide a writing current I_write. The drain of the writing current driving transistor 67 is connected to a high voltage terminal (VHV), its source is connected to the drain of the bit line transistor 21, and its gate receives a reference writing voltage Vref_write. The writing current I_write flows through a series circuit formed by the bit line transistor 21, the word line transistor 22, the resistive-type memory cell 23 and the source line transistor 24, and creates a writing voltage V_write at the drain of the bit line transistor 21.

In addition, the circuit 60 for self-terminated writing with quasi-constant voltage drop across a resistive-type memory cell can further comprise a reference writing voltage generator 63, a reference writing voltage capacitor C_ref, and a charge processing circuit 62. The reference writing voltage generator 63 can be configured to generate a reference writing voltage Vref_write. One terminal of the reference writing voltage capacitor C_ref is connected to the power supply (VSS) while the other terminal of the reference writing voltage capacitor C_ref is coupled to the reference writing voltage Vref_write. The reference writing voltage capacitor C_ref is configured to store the reference voltage Vref_write. The charge processing circuit 62 has an input and an output, and can be configured to adjust the reference writing voltage Vref_write stored in the reference writing voltage capacitor C_ref. The input of the charge processing circuit 62 receives the writing voltage V_write, and the output of the charge processing circuit 62 is coupled to the reference writing voltage Vref_write, so as to properly adjust the reference writing voltage Vref_write during a writing process.

Figure 10B:
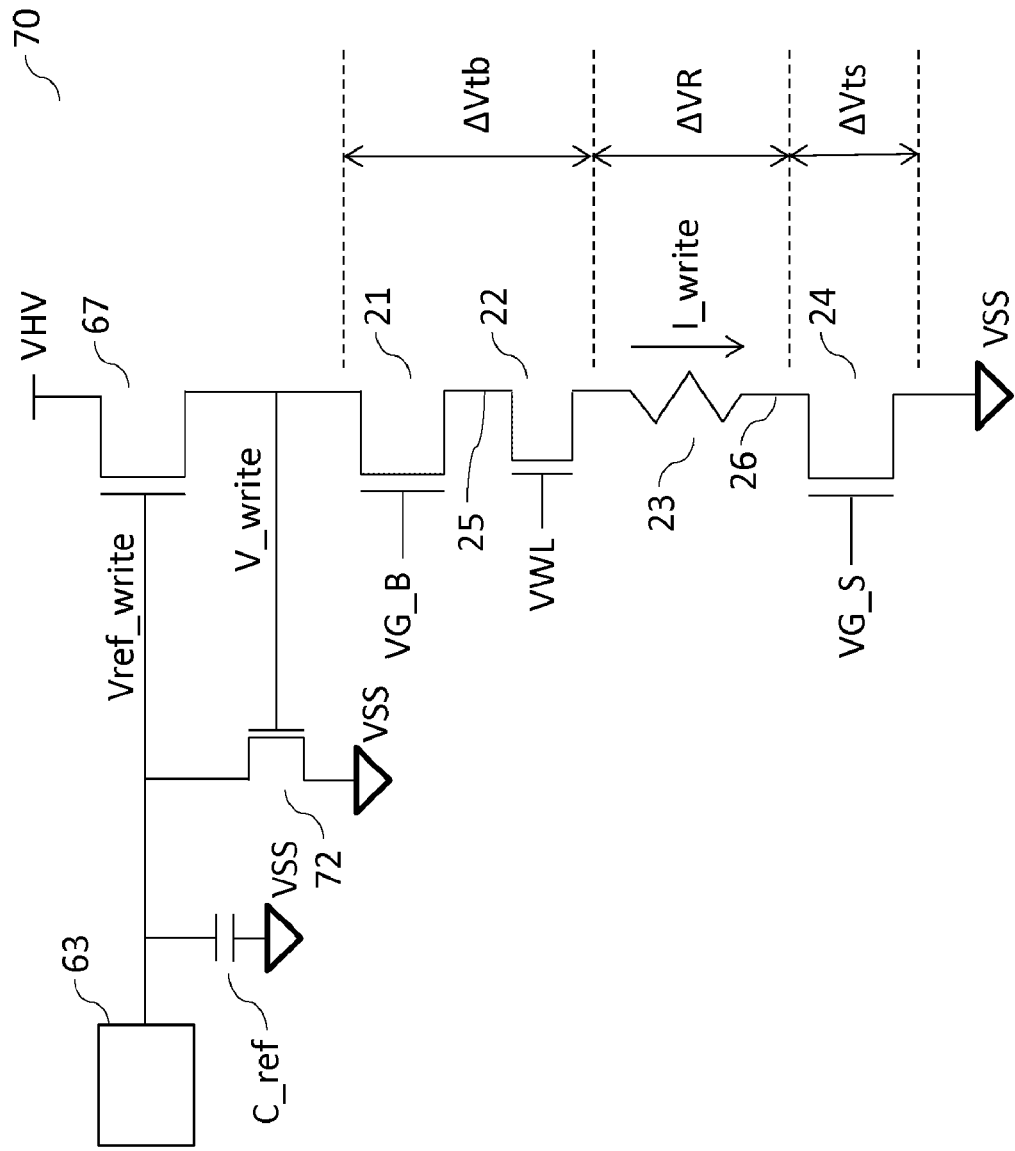
FIG. 10B shows a schematic view illustrating a circuit for self-terminated writing with quasi-constant voltage drop across resistive-type memory cell according to another embodiment of the present invention.

For example, FIG. 10B shows a schematic view illustrating a circuit 70 for self-terminated writing with quasi-constant voltage drop across a resistive-type memory cell according to one embodiment of the present invention (corresponding to the method shown in FIG. 5). In the circuit 70 for self-terminated writing with quasi-constant voltage drop across a resistive-type memory cell, for example, the charge processing circuit can be a discharging transistor 72. During the writing process, the resistance Rcell of the resistive-type memory cell 23 increases, so the writing voltage V_write increases as well. When the writing voltage V_write increases, the discharging transistor 72 becomes more conductive, so the reference writing voltage Vref_write decreases. Then, when the reference voltage Vref_write decreases, the writing current driving transistor 67 becomes less conductive, so the writing voltage V_write can decrease, thereby the voltage drop ΔVR between two terminals of the resistive-type memory cell 23 can keep substantially constant or only increase slightly.

In addition, a size of the discharging transistor 72 can be pre-adjusted according to characteristics of the resistive-type memory cells 23 on each wafer, so that the writing current driving transistor 67 can be turned off by the discharging transistor 72 when the writing voltage V_write reaches a target value, thereby achieving the purpose of self-terminated writing.

According to another embodiment of the present invention, the charge processing circuit 62 can be a charging circuit while the writing current driving transistor 67 can be a P-channel MOS FET.

The circuit 60 for self-terminated writing with quasi-constant voltage drop across a resistive-type memory cell can achieve the purpose of preventing overstressing the resistive-type memory cell and the purpose of preventing superfluous time of stressing the resistive-type memory cell without a dummy series circuit. Since it has simpler circuit and takes smaller area, it could be used in low-cost applications.

Through the detailed description above, it can be understood the method for writing with quasi-constant voltage drop across a resistive-type memory cell, the method for self-terminated writing in a resistive-type memory cell, or both in the present invention. With these methods, the voltage drop across the resistive-type memory cell may keep constant or only slightly increase during a writing process, so as to prevent overstressing the resistive-type memory cell. On the other hand, by monitoring the writing current or the writing voltage, it can be determined whether the resistance of the resistive-type memory cell reaches a target value, thereby achieving a self-terminated writing and preventing superfluous time of stressing the resistive-type memory cell. In addition, another embodiment of the present invention provides a low-cost scheme for writing with quasi-constant voltage drop across a resistive-type memory cell, which can also obtain the same advantages.

Although the foregoing embodiments have been described in some detail for purposes of clarity of understanding the present invention, it will be apparent to a person of ordinary skills in the art that certain changes and modifications may be practiced according to the teachings in the specification. It should be noted that the present invention covers all the changes, modifications, additions, alternatives and equivalents thereof. Accordingly, the present invention is not to be limited to the detailed embodiments given herein, but covers the content as defined by the scope and spirit of the appended claims.

What is claimed is:

1. A method for writing with constant voltage drop across resistive-type memory cell, comprising:
   creating a writing voltage and a writing current flowing through a resistive memory cell;
   reproducing the writing current to generate a reproduced writing current at a predetermined ratio to the writing current;
   flowing the reproduced writing current through a dummy circuit to generate a dummy writing voltage;
   adding the dummy writing voltage and a reference voltage to generate a reference writing voltage, wherein the dummy writing voltage slightly and proportionally increases during writing; and
   adjusting the writing voltage and the writing current according to the reference writing voltage, so that a voltage drop across the resistive memory cell keeps constant or slightly increases during writing.

2. The method of claim 1, wherein sizes of devices in the dummy circuit is adjustable so as to adjust the voltage drop across the resistive memory cell.

3. The method of claim 1, wherein the reference voltage is predetermined according to characteristics of the resistive memory cell.

4. The method of claim 2, wherein the reference voltage is predetermined according to characteristics of the resistive memory cell.

5. A method for self-terminated writing with quasi-constant voltage drop across resistive-type memory cell, comprising:
   creating a writing voltage and a writing current flowing through a resistive memory cell;
   reproducing the writing current to generate a reproduced writing current at a predetermined ratio to the writing current;
   flowing the reproduced writing current through a dummy circuit to generate a dummy writing voltage;
   adding the dummy writing voltage and a reference voltage to generate a reference writing voltage, wherein the dummy writing voltage slightly and proportionally increases during writing;
   adjusting the writing voltage and the writing current according to the reference writing voltage, so that a voltage drop across the resistive memory cell keeps constant or slightly increases during writing;
   issuing a termination signal when the reproduced writing current reaches a predetermined target current value; and
   turning off related writing circuits by the termination signal so as to optimize a writing period of the resistive-type memory cell.

6. A method for self-terminated writing with quasi-constant voltage drop across resistive-type memory cell, comprising:
   creating a writing current flowing through a resistive memory cell according to a predetermined reference writing voltage, and creating a writing voltage;
   predetermining a charging or discharging rate of a reference writing voltage relative to a level of the writing voltage according to characteristics of the resistive-type memory cell;
   charging or discharging the reference writing voltage according to the level of the writing voltage;
   adjusting the writing voltage and the writing current according to the reference writing voltage, so that a voltage drop across the resistive-type memory cell keeps constant or slightly increases during writing; and monitoring the writing voltage, and turning off related writing circuits when the writing voltage reaches a predetermined target voltage value so as to optimize a writing period of the resistive-type memory cell.

7. The method of claim 6, wherein the target voltage value is predetermined according to characteristics of the resistive-type memory cell.

8. A circuit for writing with quasi-constant voltage drop across resistive-type memory cell, comprising:

a resistive-type memory cell for storing data to be written, the resistive-type memory cell being a two-terminal device;

a source line transistor having a drain, a source and a gate, the drain being connected to one terminal of the resistive-type memory cell, the source being connected to a power supply, and the gate being coupled to a source line driving voltage;

a word line transistor having a drain, a source and a gate, the source being connected to the other terminal of the resistive-type memory cell, and the gate being coupled to a word line driving voltage;

a bit line transistor having a drain, a source and a gate, the source being connected to the drain of the word line transistor, and the gate being coupled to a bit line driving voltage;

a writing current driving transistor for providing a writing current, the writing current driving transistor having a drain, a source and a gate, the drain being connected to a positive power supply, the source being connected to the drain of the bit line transistor, and the gate being configured to receive a writing voltage, wherein the writing current flows through a series circuit formed by the bit line transistor, the word line transistor, the resistive-type memory cell, and the source line transistor;

a writing buffer having a positive input, a negative input and an output, the writing buffer configured for providing the writing voltage at the output, the negative input being connected to the output to form a negative feedback, the positive input being configured to receive a reference writing voltage;

a dummy source line transistor having a drain, a source and a gate, the source being connected to the power supply and the gate being coupled to the source line driving voltage;

a dummy word line transistor having a drain, a source and a gate, the source being connected to the drain of the dummy source line transistor and the gate being coupled to the word line driving voltage;

a dummy bit line transistor having a drain, a source and a gate, the source being connected to the drain of the dummy word line transistor and the gate being coupled to the bit line driving voltage;

a current mirror circuit having an input and an output and configured for creating a dummy writing current which is the same as the writing current, the input being configured to receive the writing voltage, the output being connected to the drain of the dummy bit line transistor, wherein the dummy writing current flows through a dummy series circuit formed by the dummy bit line transistor, the dummy word line transistor and the dummy source line transistor and creates a dummy writing voltage at the drain of the dummy bit line transistor;

a reference voltage generator for creating a predetermined reference voltage; and a voltage adder configured for receiving and adding the dummy writing voltage and the reference voltage and outputting the reference writing voltage to the positive input of the writing buffer.

9. The circuit of claim 8, wherein sizes of the dummy bit line transistor and the dummy source line transistor are adjustable to adjust the voltage drop across the resistive-type memory cell.

10. The circuit of claim 8, wherein the current mirror circuit is a transistor matching the writing current driving transistor.

11. The circuit of claim 9, wherein the current mirror circuit is a transistor matching the writing current driving transistor.

12. The circuit of claim 8, wherein the reference voltage is predetermined according to characteristics of the resistive-type memory cell.

13. The circuit of claim 9, wherein the reference voltage is predetermined according to characteristics of the resistive-type memory cell.

14. A circuit for self-terminated writing with quasi-constant voltage drop across resistive-type memory cell, comprising:

a resistive-type memory cell for storing data to be written, the resistive-type memory cell being a two-terminal device;

a source line transistor having a drain, a source and a gate, the drain being connected to one terminal of the resistive-type memory cell, the source being connected to a power supply, and the gate being coupled to a source line driving voltage;

a word line transistor having a drain, a source and a gate, the source being connected to the other terminal of the resistive-type memory cell, and the gate being coupled to a word line driving voltage;

a bit line transistor having a drain, a source and a gate, the source being connected to the drain of the word line transistor, the gate being coupled to a bit line driving voltage;

a writing current driving transistor for providing a writing current, the writing current driving transistor having a drain, a source and a gate, the drain being connected to a positive power supply, the source being connected to the drain of the bit line transistor, and the gate being configured to receive a writing voltage, wherein the writing current flows through a series circuit formed by the bit line transistor, the word line transistor, the resistive-type memory cell, and the source line transistor;

a writing buffer having a positive input, a negative input, an output and an enabling terminal, the writing buffer configured for providing the writing voltage at the output, the negative input being connected to the output to form a negative feedback, the positive input being configured to receive a reference writing voltage, the enabling terminal being configured to receive a termination signal;

a dummy source line transistor having a drain, a source and a gate, the source being connected to the power supply and the gate being coupled to the source line driving voltage;

a dummy word line transistor having a drain, a source and a gate, the source being connected to the drain of the dummy source line transistor and the gate being coupled to the word line driving voltage;

a dummy bit line transistor having a drain, a source and a gate, the source being connected to the drain of the dummy word line transistor and the gate being coupled to the bit line driving voltage;

a current mirror circuit having an input and an output and configured for creating a dummy writing current which is the same as the writing current, the input being configured to receive the writing voltage, the output being connected to the drain of the dummy bit line transistor, wherein the dummy writing current flows through a dummy series circuit formed by the dummy bit line transistor, the dummy word line transistor and the dummy source line transistor and creates a dummy writing voltage at the drain of the dummy bit line transistor;

a reference voltage generator for generating a predetermined reference voltage;

a voltage adder for receiving and adding the dummy writing voltage and the reference voltage and outputting the reference writing voltage to the positive input of the writing buffer;

a termination voltage generator for generating a predetermined termination voltage; and a voltage comparator having a positive input, a negative input and an output and configured for providing the termination signal at the output, the positive input being configured for receiving the writing voltage output from the writing buffer, the negative input being configured for receiving the termination voltage output from the termination voltage generator, the voltage comparator comparing the writing voltage with the termination voltage, wherein the termination signal is activated when the writing voltage is higher than the termination voltage, so as to turn off the writing buffer.

15. The circuit of claim 14, wherein sizes of the dummy bit line transistor and the dummy source line transistor are adjustable to adjust the voltage drop across the resistive-type memory cell.

16. The circuit of claim 14, wherein the current mirror circuit is a transistor matching the writing current driving transistor.

17. The circuit of claim 15, wherein the current mirror circuit is a transistor matching the writing current driving transistor.

18. The circuit of claim 14, wherein the reference voltage is predetermined according to characteristics of the resistive-type memory cell.

19. The circuit of claim 15, wherein the reference voltage is predetermined according to characteristics of the resistive-type memory cell.

20. The circuit of claim 14, wherein the termination voltage is predetermined according to characteristics of the resistive-type memory cell.

21. The circuit of claim 15, wherein the termination voltage is predetermined according to characteristics of the resistive-type memory cell.

* * * * *